United States Patent

[11] 3,614,776

[72] Inventors Dean B. Eshleman
Lincoln;
Alice M. D'Entremont, Boston, both of Mass.
[21] Appl. No. 777,123
[22] Filed Nov. 19, 1968
[45] Patented Oct. 19, 1971
[73] Assignee Control Data Corporation
Minneapolis, Minn.

[54] PULSE SYNCHRONIZATION FOR DIGITAL TO ANALOG CONVERTERS
6 Claims, 1 Drawing Fig.

[52] U.S. Cl. ....................340/347 DA
[51] Int. Cl. ....................H03k 13/02
[50] Field of Search ....................340/347

[56] References Cited
UNITED STATES PATENTS
3,484,777 12/1969 Delagrange .................. 340/347
3,129,420 4/1964 Marez .................. 340/347
2,963,698 12/1960 Slocomb .................. 340/347
2,658,139 11/1953 Abate .................. 340/347

*Primary Examiner*—Maynard R. Wilbur
*Assistant Examiner*—Jeremiah Glassman
*Attorneys*—Paul L. Sjoquist and Joseph A. Genovese

ABSTRACT: A method and apparatus for performing the method for eliminating transients at the output of a digital to analog (D/A) converter is disclosed. Pulses representing all bits of a multibit digital word applied to a D/A converter are time synchronized by independently delaying their leading and trailing edges. The delay is achieved by integrating the pulse edges of all bits at a variable rate and applying the integrated pulse edges to a threshold circuit to recover them. Varying the integration rate of the various bits allows the time synchronization.

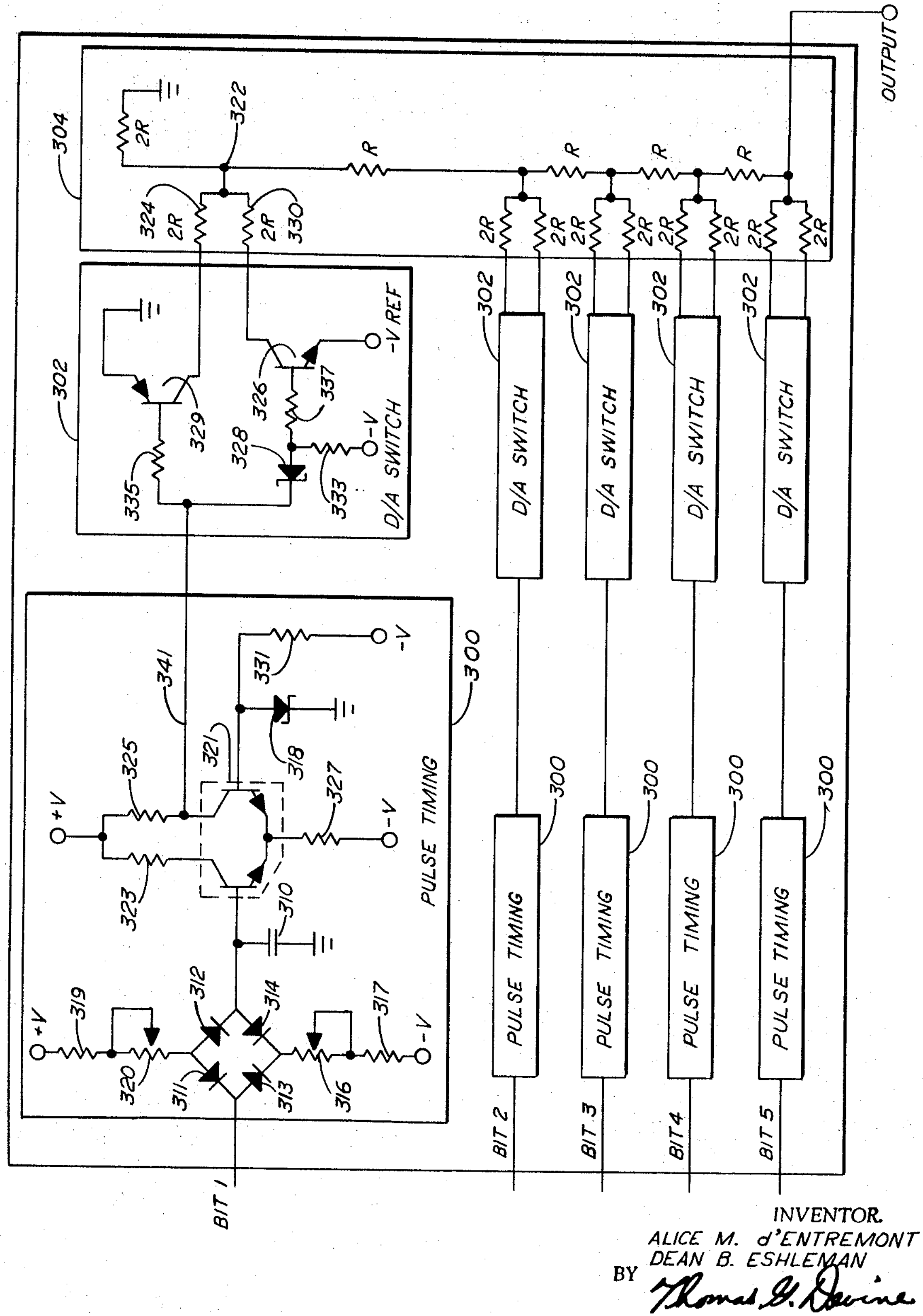
INVENTOR.
ALICE M. d'ENTREMONT
DEAN B. ESHLEMAN
BY Thomas G. Devine
ATTORNEY

PULSE SYNCHRONIZATION FOR DIGITAL TO ANALOG CONVERTERS

BACKGROUND

The present invention arose in response to the need for a D/A converter providing conversion of information at a 10 megahertz rate. A 10 megahertz conversion rate is not possible using conventional D/A converters because they are limited by the method conventionally used to eliminate the transients occurring at their output due to nonsimultaneous switching of the individual D/A bits. This conventional method consists of passing the D/A signal through a sample and hold circuit to hold the signal until all the D/A switches settle. The speed of this D/A converter is then limited by the length of the hold pulse. The hold pulse must be at least as long as the time necessary to allow all the D/A switches to settle in addition to any time difference (skew) between the arrival of the individual bits of a data word to be converted to an analog signal. Also, the length of the hold pulse for the sample and hold circuits previously used is dependent upon the voltage amplitude of the signal from the D/A converter. The upper limit on information conversion rates using prior art D/A converters is on the order of 3 megahertz.

The problem, however, was to replace the function provided by the sample and hold circuit—the stabilization of the D/A converter output to eliminate transients. The solution found was to coordinate or time-synchronize the pulses supplied to the D/A converter such that no transients occur.

DESCRIPTION

It is an object of the present invention to provide a faster D/A converter than heretofore possible.

It is a further object of the present invention to eliminate output transients from a D/A converter without the use of a sample and hold circuit.

It is a still further object of the present invention to provide time synchronization of the input pulses to a D/A converter.

These and further objects and advantages of the present invention will become clearer in the light of the following detailed description of an illustrative embodiment of the invention and from the appended claims.

The illustrative embodiment may best be described by reference to the single FIGURE of the drawing showing a preferred embodiment of a five bit D/A converter using the teachings of the present invention.

In the FIGURE, each bit of the 5-bit digital data word to be converted to an analog signal is applied to a separate input line. These five lines are all gated into the D/A converter by the same timing signal, but individual circuit differences result in slight variations in their arrival times. The use of this invention allows all circuit variations which my occur prior to and including the ladder network 304 to be compensated for. For the purposes of the present specification, the word "digital" means binary quantized information. Each bit of the 5-bit data word is passed through a pulse timing circuit 300 and to a D/A switch 302. The five D/A switches 302 each provide output digital signals to a ladder network 304, and the analog signal output is taken from ladder network 304.

OPERATION

The basic operation of providing digital signals to various points of a ladder network such as ladder 304 through a D/A switch such as 302 is familiar to those skilled in the art. The additional operation provided by pulse timing circuit 300 is new, however. The operation of pulse timing circuit 300 may be explained by considering the operation of the circuit under the two input signal conditions representing the two binary levels, a negative 6 volts and ground. Originally capacitor 310 has no net stored charge. Therefore, the voltage input to differential amplifier 321 from capacitor 310 is zero. Assuming a minus 6 signal is applied to the input labeled bit 1, diode 311 of the diode bridge is rendered conducting, and diodes 312 and 313 are rendered nonconducting. Thus the voltage upon capacitor 310 beings to charge towards the negative supply through resistors 316 and 317 and diode 314. The rate of charge of capacitor 310 may be directly controlled by varying the value of variable resistor 316. When the magnitude of the voltage upon capacitor 310 exceeds the thresholding voltage of Zener diode 318, a negative-going output signal is provided on line 341 by differential amplifier 321, and the leading edge of the input pulse is recovered. It is seen that the leading edge of a negative-going pulse impressed upon the input labeled bit 1 may thus be shifted in time by changing the value of variable resistor 316. By varying the timing of all leading edges, they may be made to occur simultaneously and thus eliminate any leading edge transients. Similarly, assuming a negative voltage upon capacitor 310 and the impression of a zero-voltage signal upon the input labeled bit 1, diodes 314 and 311 of the diode bridge are rendered nonconducting and the voltage upon capacitor 310 discharges through diode 312 towards the positive supply voltage. When the magnitude of the voltage upon capacitor 310 decreases below the thresholding voltage applied to differential amplifier 321 by zener diode 318, a second change of state of differential amplifier 321 occurs. Thus, the trailing edge of the input signal is recovered. The rate of discharge of capacitor 310 is directly controlled by resistor 319, variable resistor 320, and diode 312. The trailing edge of the input pulses may thus be aligned so that no trailing edge transients occur. The worst transients occur when some bits are transitioning in a positive-going direction while others are transitioning in a negative-going direction.

The output of pulse timing circuit 300 is provided to D/A switch 302. A slightly negative voltage will forward bias the emitter-base junction of transistor 329 and render it conducting. This connects junction point 322 of ladder network 304 to ground through resistor 324. If the voltage provided by differential amplifier 321 of pulse timing circuit 300 is slightly positive, transistor 329 will be rendered nonconducting, and transistor 326 will be rendered conducting since zener diode 328 is designed to provide a voltage drop approximating the negative voltage $V_{REF}$ applied to the emitter of transistor 326. Under these conditions, the voltage appearing across the base-emitter junction of transistor 326 will forward bias it and connect junction point 322 of ladder network 304 to the negative voltage $V_{REF}$ through resistor 330. Thus, junction point 322 is either connected to a negative voltage or to ground— each level indicating one of the two binary states. The remaining four bits of the 5-bit group are similarly treated and provided outputs to ladder network 304.

The following component values and types have given good performance in the embodiment described herein. They are listed by way of example only, it being understood that changes may be made to meet particular design considerations without departing from the recited inventive concepts:

| | |
|---|---|
| Resistors 316,317,319,320 | 2,000 ohms |
| Resistors 323,325,331,333 | 1,000 ohms |
| Resistor 327 | 620 ohms |
| Resistors 335,337 | 330 ohms |
| Resistance "R" | 221 ohms |
| Resistance "2R" | 442 ohms |
| Diodes 311,312,313,314 | IN914A |
| Diode 318 | IN747A |
| Diode 328 | IN758 |
| Transistors 321 | 2N2369A |
| Transistor 329 | 2N4209 |
| Transistor 326 | 2N2369 |
| Voltage supply "V" | 20 volts |
| Voltage supply "$V_{REF}$" | 10 volts |

Now that the basic teachings of the present invention have been explained, many extensions and variations will be obvious to one skilled in the art. For example, the present invention may be used with many types of ladder networks and many types of D/A switches.

Also, while a 5-bit D/A converter has been described, no limitation to this number is intended. More or fewer bits may be operated upon simultaneously.

Additionally, many types of threshold circuits other than differential amplifier 321 will be envisioned by those skilled in the art.

The preferred embodiment of the present invention is described for illustrative purposes only; no limitation is intended. Many variations will be obvious to one skilled in the art. It is desired that the present invention be limited only by the appended claims in which it is intended to cover the full scope and spirit of the present invention.

1. In conjunction with a digital to analog (D/A) converter including switching circuitry and a ladder network, the improvement of apparatus for synchronizing the pulses applied to the switching circuitry, comprising:

a. an input adapted to receive digital signals;

b. a diode bridge having four junction points;

c. a first voltage supply;

d. a first resistance connected between one junction point of the diode bridge and the first voltage supply;

e. a second voltage supply;

f. a second resistance connected between another junction point of the diode bridge and the second voltage supply;

g. means for connecting the input to another junction point of the diode bridge;

h. a capacitor connected to another junction point of the diode bridge;

i. a threshold circuit, accepting a voltage on the capacitor and a reference voltage, for providing a first signal output when the voltage from the capacitor is greater than the reference voltage and for providing a second signal output when the voltage from the capacitor is less than the reference voltage; and j. means for connecting the threshold circuit to the switching circuitry.

2. The apparatus of claim 1, wherein the first and second resistances comprise variable resistors.

3. The apparatus of claim 1, wherein the threshold circuit comprises a differential transistor amplifier having a first input adapted to accept the capacitor voltage, a second input adapted to accept a reference voltage input, and an output adapted to provide a first voltage level output when the voltage applied to the first input exceeds the voltage applied to the second input and to provide a second voltage level output when the voltage applied to the first input is less than the voltage applied to the second input.

4. The apparatus of claim 3, further comprising a zener diode for providing the reference voltage.

5. The method of time synchronizing all bits of a multibit digital word applied to a digital to analog converter to eliminate output transients from the converter, comprising:

a. providing a variable time delay for the leading edge of each bit;

b. adjusting the variable time delays for time synchronizing the leading edges of all bits;

c. providing a variable time delay for the trailing edge of each bit;

d. adjusting the variable time delays for time synchronizing the trailing edges of all bits; and e. applying the time synchronized bits to a digital to analog converter.

6. The method of claim 5, wherein the method of time synchronization comprises:

a. integrating each bit edge;

b. applying the integrated edge to a threshold circuit to recover the edge; and c. varying the integration time to time synchronize the edges.